United States Patent [19]

Hijikata et al.

[11] Patent Number: 4,578,559

[45] Date of Patent: Mar. 25, 1986

[54] PLASMA ETCHING METHOD

[75] Inventors: Isamu Hijikata, Tokyo; Akira Uehara; Hisashi Nakane, both of Kanagawa, all of Japan

[73] Assignee: Tokyo Ohka Kogyo Co., Ltd., Kanagawa, Japan

[21] Appl. No.: 649,164

[22] Filed: Sep. 10, 1984

Related U.S. Application Data

[63] Continuation of Ser. No. 424,289, Sep. 27, 1982, abandoned.

[30] Foreign Application Priority Data

Mar. 10, 1982 [JP] Japan ................... 57-38807

[51] Int. Cl.⁴ ................ B23K 9/00; H01L 21/306
[52] U.S. Cl. ................ 219/121 PE; 219/121 PG; 156/345; 156/646; 204/298; 204/192 E
[58] Field of Search ............. 219/121 PD, 121 PG, 219/121 PE, 121 PF, 121 PR; 156/345, 643, 646; 204/298, 192 E, 164

[56] References Cited

U.S. PATENT DOCUMENTS

| | | | |
|---|---|---|---|
| 4,297,162 | 10/1981 | Mundt et al. | 219/121 PG |
| 4,324,611 | 4/1982 | Vogel et al. | 156/643 |
| 4,342,901 | 8/1982 | Zajac | 219/121 PG |
| 4,370,196 | 1/1983 | Vossen, Jr. et al. | 156/646 |
| 4,373,990 | 2/1983 | Porter | 156/646 |
| 4,380,488 | 4/1983 | Reichelderfer et al. | 156/646 |

FOREIGN PATENT DOCUMENTS 0015424  1/1982  Japan ................... 156/643

Primary Examiner—M. H. Paschall
Attorney, Agent, or Firm—Irving M. Weiner; Joseph P. Carrier; John J. Cantarella

[57] ABSTRACT

A plasma etching method employing a parallel-plate type plasma etching device which comprises a reaction chamber, a substantially plate-like ground electrode and a substantially plate-like counter electrode both disposed in parallel with each other within the reaction chamber. The method includes the steps of placing a material to be etched on the ground electrode and carrying out an electric discharge with a spacing between the electrodes being substantially 3 to 10 mm. Etching is performed exactly at a high speed in an anisotropic form without requiring a high degree of vacuum.

10 Claims, 11 Drawing Figures

PLASMA ETCHING METHOD

This is a continuation of application Ser. No. 424,289, filed 9/27/82, now abandoned.

BACKGROUND OF THE INVENTION

1. Field of the Invention

The present invention relates generally to a plasma etching method. More particularly, the invention relates to a plasma etching method employing a parallel plate type plasma etching device whereby an anisotropic etching is attained.

2. Description of Relevant Art

In the manufacture of a large-scale integrated circuit such as an LSI or ultra LSI, it is necessary that a semiconductor material, a semiconductor film used for the production of semiconductor devices, an insulation film, or a metallic film be etched exactly following a fine pattern. At present, in the manufacture of LSI's or the like, there is employed a plasma etching method wherein a gas is activated by utilization of an electric discharge and the surface of a material to be etched is etched by the activated gas following a pattern.

Generally employed as a device for performing the aforesaid plasma etching is a so-called cylindrical type etching device wherein a material to be etched is placed in a cylindrical reaction tube made of quartz, an electrode is wound around the quartz tube in the form of a coil or an electrode plate is fixed around such tube, and the gas in the reaction chamber is plasmized by application of a high frequency to thereby etch the surface of the material to be etched.

In the etching employing the aforesaid cylindrical etching device, however, the ion bombardment contributes only at a very low energy to the material to be etched, and a radical etching predominates. Therefore, as shown for example in FIG. 8 of the accompanying drawings, if a polysilicon film 2 is formed on a base 1 made of $SiO_2$, and then a photoresist mask 3 is applied onto the surface of the film 2 and the film 2 is etched, there is performed an isotropic etching involving a side etching as shown in FIG. 9. Such an isotropic etching makes it impossible to attain an exact etching along the mask pattern, and thus there is a limit with respect to attainable fineness.

To avoid the aforesaid drawback, it is desirable to effect a so-called anisotropic etching involving a perpendicular etching of the polysilicon film 2 with respect to the base 1, as shown in FIG. 10. As a device for carrying out such an anisotropic etching, there is known a parallel-plate type plasma etching device such as shown in FIG. 11, wherein a plate-like ground electrode 5 and a counter electrode 6 (having an area width substantially equal to that of a wafer to be etched, as shown in FIG. 11) are disposed within a reaction chamber in spaced parallel relation in the vertical direction, a semiconductor wafer is placed on the lower ground electrode 5, while the spacing between the electrodes 5 and 6 is set at 30 to 100 mm in consideration of the uniformity of etching, etc., and a high-frequency voltage is applied between the electrodes, whereby an etching gas dissociates in the discharge zone to generate ions, electrons and radicals. Because the mobility of electrons and that of ions are different, there occurs a deviated electric field near the electrode, where a negative potential acts against the discharge zone, so that reactive ions are accelerated onto the electrode, thus permitting performance of an etching having directionality. However, under some particular gas and reaction conditions, etching is carried out mainly by a radical as a chemical reaction source, and an anisotropic etching is not always attained. Therefore, such known plasma etching device is not considered satisfactory at present, and requires a higher integration.

As another method for carrying out an anisotropic etching, there is known a reactive ion etching method wherein etching is performed by producing a bias voltage (cathode drop voltage) positively. However, such method is disadvantageous in that etching must be conducted at an extremely high vacuum (substantially 10 Pa), thus requiring the provision of a suitable apparatus therefor, and the etching speed is low.

In this respect, it is also known that such reactive ion etching is carried out at a pressure no higher than 100 mTorr and in which there does occur a physical etching resulting in an anisotropic character of etch, whereas a plasma etching, with which the present invention is concerned, is carried out a pressure higher than 100 mTorr and no higher than 10 Torr (100 mTorr $\leq P < 10$ Torr), and in which there does occur a chemical etching resulting in an isotropic character of etch.

The present invention effectively overcomes the above-mentioned drawbacks attendant conventional plasma etching methods.

SUMMARY OF THE INVENTION

The present invention provides a plasma etching method employing a parallel-plate type plasma etching device which comprises a reaction chamber, a substantially plate-like ground electrode and a substantially plate-like counter electrode both disposed in parallel with each other within the reaction chamber. The method comprises the steps of placing a material to be etched on the ground electrode and carrying out an electric discharge with a spacing between the electrodes being 3 to 10 mm.

It is an object of the present invention to provide a plasma etching method whereby etching can be performed exactly at a high speed in an anisotropic form without raising the degree of vacuum.

Namely, according to the present invention, there is provided a plasma anisotropic etching method which is performed under substantially the same conditions except that the inter-electrode spacing is set in such a range as greater than or equal to 3 mm and no greater than 10 mm (3 mm $\leq S < 10$ mm), as those of a plasma etching in which an isotropic etching normally occurs.

The above and further objects, details and advantages of the present invention will become apparent from the following detailed description when read in conjunction with the accompanying drawings.

DETAILED DESCRIPTION OF PREFERRED EMBODIMENTS

Figure 1:
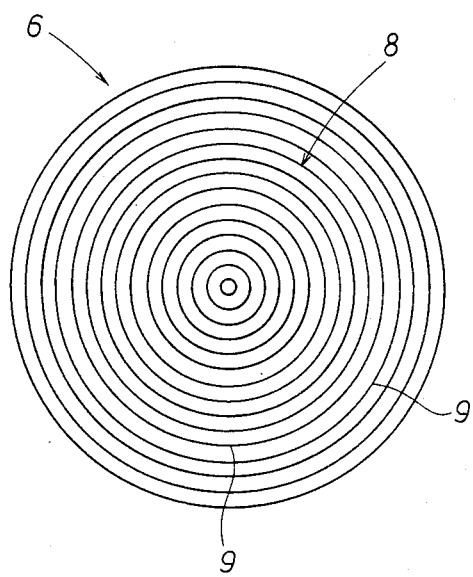
FIG. 1 is a plan view of a discharge surface of a counter electrode.

With reference to FIG. 1, there is shown the entirety of an upper or counter electrode 6 (having an area width substantially equal to that of a wafer to be etched). The upper electrode 6 has a discharge surface 8 on which are formed a plurality of concentric projections 9 each being substantially 0.5 mm high and spaced at intervals of substantially 1 mm.

Figure 2:
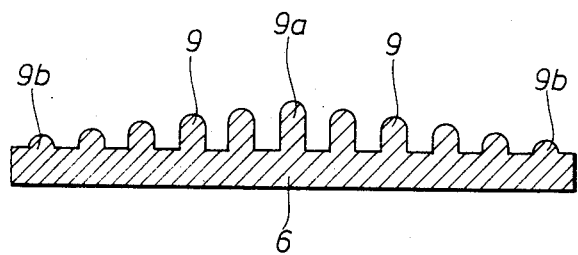
FIG. 2 is a longitudinally sectioned side view showing a modification of a counter electrode.

The projections 9, as shown in FIG. 2, may be constructed in such a manner that the height of a central projection 9a is made largest and the remaining projections are made gradually smaller in height toward the outermost projection 9b, i.e., defining a substantially convex configuration. Alternatively, the central projection 9a may be made smallest in height while the outermost projections 9b are made larger in height, i.e., defining a substantially concave configuration.

The results of etching carried out by using the electrode 6 will be described hereinbelow with reference to FIGS. 3 through 7.

Figure 3:
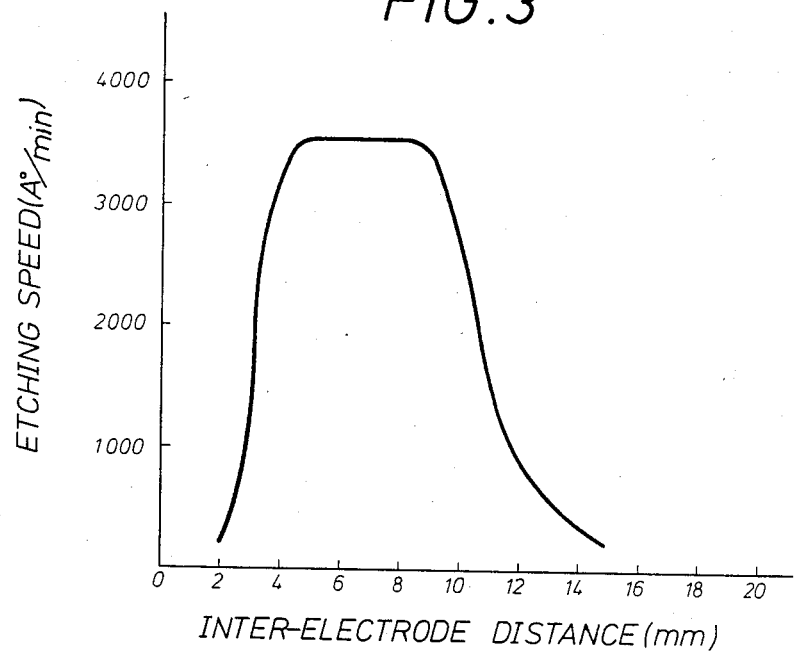
FIG. 3 is a diagram showing the relationship between the etching speed and the inter-electrode distance.
Figure 4:
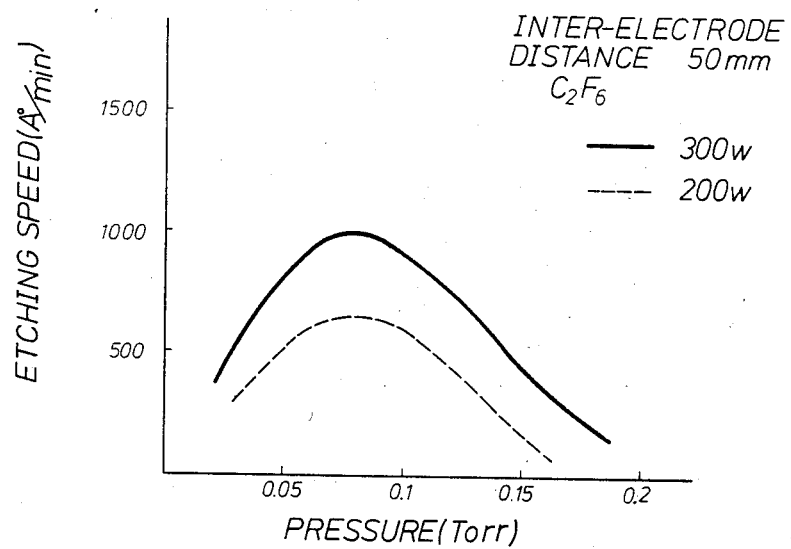
FIG. 4 is a diagram showing the relationship between the etching speed and the pressure within a reaction chamber according to a conventional example.

FIG. 3 shows the relationship between the etching speed and the inter-electrode distance in the case where $C_2F_6$ was passed over a 4-inch silicon wafer having a 6000Å thick $SiO_2$ film formed thereon and an electric discharge was allowed to take place between the electrodes at an electric power output of 300 watts and at a pressure within a reaction chamber of 0.6 Torr. FIG. 4 shows the relationship between the etching speed and the pressure within a reaction chamber according to the conventional method, i.e., at an inter-electrode distance of 50 mm, and FIG. 5 shows the same relationship at an inter-electrode distance of 7 mm.

Figure 5:
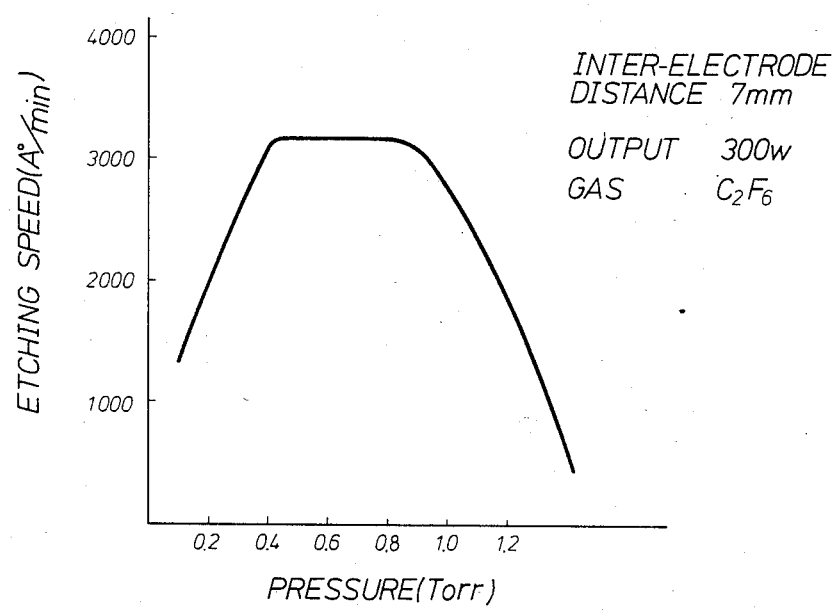
FIG. 5 is a diagram showing the relationship between the etching speed and the pressure within a reaction chamber in the case where the method of the present invention is applied.

As shown in FIGS. 3 through 5, when the inter-electrode distance is in the range of 3 to 10 mm, the etching speed reaches as high as 2000 to 2700Å per minute and thus it is twice or more in comparison with the conventional method, and even at a treating gas pressure above 1.0 Torr, etching can be performed at a sufficiently high etching speed. In contrast therewith, according to the conventional method, a favorable etching cannot be attained in cases other than at a high vacuum region, for example, below 0.1 Torr.

Moreover, it will be understood that if the inter-electrode distance is not more than 2 mm, etching is scarcely performed, and if it is not less than 11 mm, the etching speed drops suddenly.

It will be also understood from FIG. 5 that when the treating gas pressure is set in the range of 0.2–1.2 Torr, the anisotropic etching speed is desirably increased, although the present invention as previously pointed out provides the anisotropic plasma etching method even under substantially the same conditions as those in an isotropic plasma etching method.

Figure 6:
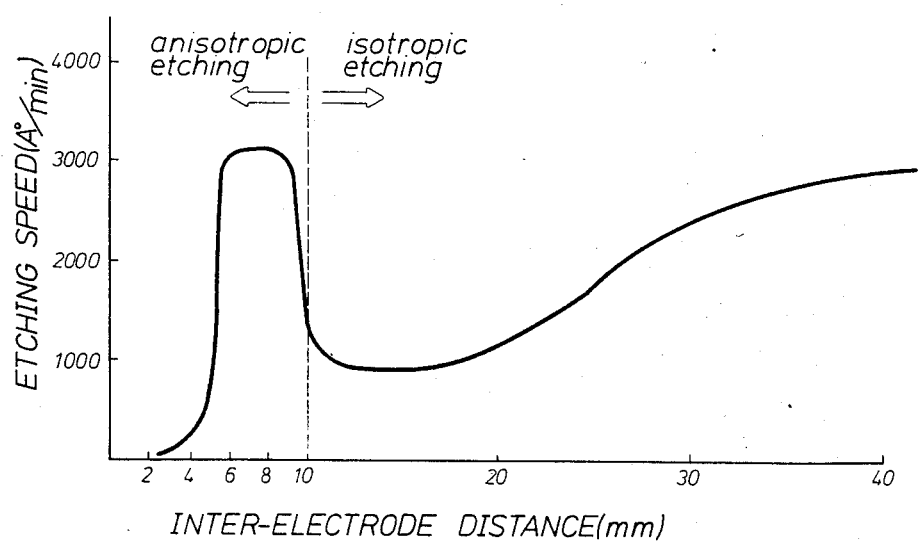
FIGS. 6 and 7 are diagrams each showing the relationship between the etching speed and the inter-electrode distance.

FIG. 6 shows the relationship between the inter-electrode distance and the etching speed in the case where etching was carried out for a 4-inch silicon wafer having a 3500Å thick polysilicon film formed thereon by using $CF_4$ as a treating gas at a pressure of 0.6 Torr and at an electric power output of 200 watts. FIG. 6 shows that if the inter-electrode distance is less than 3 mm, etching is not performed at all, and that an inter-electrode distance exceeding 10 mm causes a sudden drop of etching speed.

It will be further understood that if the inter-electrode distance is substantially in the range of 3 to 10 mm, there is performed an anisotropic etching such as a reactive ion etching, and that an inter-electrode distance exceeding 10 mm causes an increase in the ratio of an isotropic etching.

Figure 7:
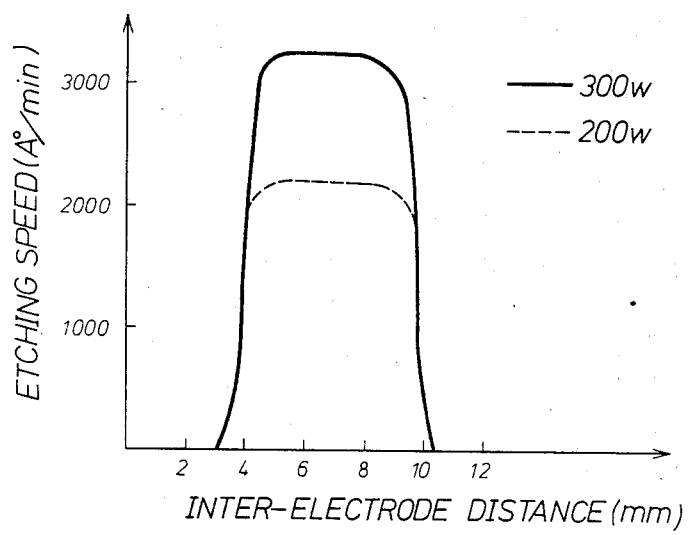
Figure 11:
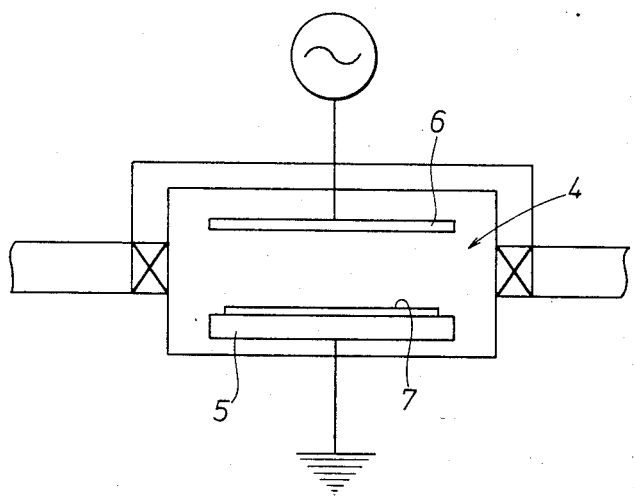
FIG. 11 is a schematic side view of a parallel-plate type plasma etching device.
Figure 8:
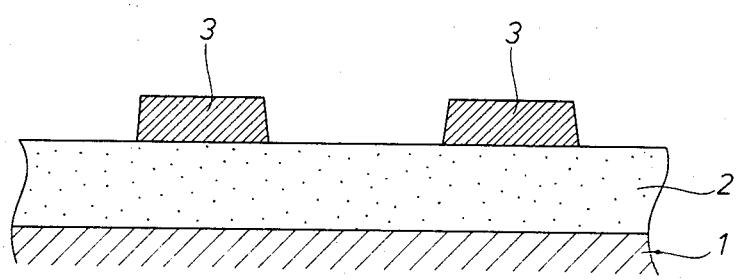
FIG. 8 is a sectional view of a semiconductor wafer before etching.
Figure 9:
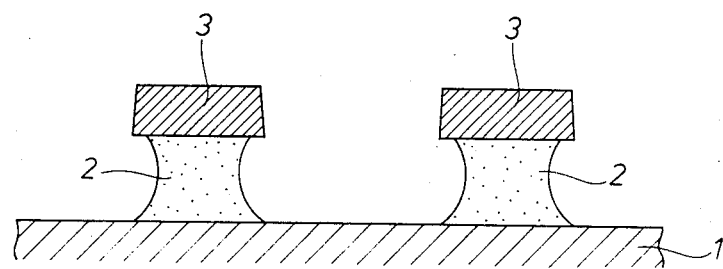
FIG. 9 is a sectional view of the semiconductor wafer in the case where an isotropic etching has been performed.
Figure 10:
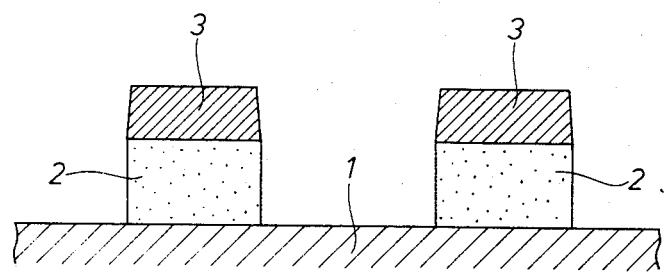
FIG. 10 is a sectional view of the semiconductor wafer in the case where an anisotropic etching has been performed.

FIG. 7 shows the relationship between the inter-electrode distance and the etching speed in the case where etching was carried out for a 4-inch silicon wafer having a 6000Å thick $SiO_2$ film formed thereon by using $CHF_3$ as a treating gas at a pressure of 0.8 Torr and at electric power outputs of 200 and 300 watts. In this case, the etching was performed at inter-electrode distances only in the range of substantially 3 to 10 mm, and all of the etched shapes were anisotropic. At inter-electrode distances outside the above range, etching was not effected at all, not to mention isotropic etching.

Furthermore, various materials were etched with treating gases suitable therefor. As a result, as in the results obtained above, the peak effect appeared at inter-electrode distances ranging from substantially 3 to 10 mm. This is presumed to be due to a closer spacing of the electrodes enhancing the effect of an electric field and the directional property, and consequently etching is performed by an ionic reaction at an increased speed.

Etching was further performed using a counter electrode having a discharge surface which was neither convexed nor concaved. Also in this case, an anisotropic etching could be performed at a high speed, but the uniformity of etching was somewhat inferior.

According to the present invention, as will be apparent from the foregoing description, the inter-electrode distance is set substantially in the range of 3 to 10 mm in performing etching employing a parallel-plate type plasma etching device, and consequently an anisotropic etching is performed at a high speed without requiring a high vacuum.

From the foregoing, it will be understood that the present invention provides many advantages. For example, an LSI chip having a finer pattern can be produced less expensively and more rapidly.

Although there have been described what are at present considered to be the preferred embodiments of the invention, it will be understood that the invention may be embodied in other specific forms without departing from the spirit or essential characteristics thereof. The present embodiments are therefore to be considered in all respects as illustrative, and not restrictive. The scope of the invention is indicated by the appended claims rather than by the foregoing description.

We claim:

1. A plasma anisotropic etching method employing a parallel-plate type plasma etching device which comprises a reaction chamber, a substantially plate-like ground electrode and a substantially plate-like counter electrode both disposed in parallel with each other within said reaction chamber, the method comprising the steps of:
- placing a material to be etched on said ground electrode;
- carrying out an electric discharge with a spacing (s) between both said electrodes such that the spacing (s) is greater than 3 mm and no greater than 10 mm (i. e., 3 mm $\leq S < 10$ mm); and
- the plasma anisotropic etching is carried out with the same treating gases, pressure and radio-frequency power as in a plasma isotropic etching.

2. A plasma etching method according to claim 1, wherein:
said counter electrode has an uneven discharge surface.

3. A plasma etching method according to claim 2, wherein:
said counter electrode has a substantially concave discharge surface.

4. A plasma etching method according to claim 2, wherein:
said counter electrode has a substantially convex discharge surface.

5. A plasma etching method according to claim 1, wherein:
the treating pressure is in the range of 0.1 to 10 Torr.

6. A plasma etching method according to claim 5, wherein:
the treating pressure is in the range of 0.2 to 1.2 Torr.

7. A parallel-plate type plasma etching device comprising:
- a reaction chamber;
- a substantially plate-like ground electrode on which a material to be etched is placed;
- a substantially plate-like counter electrode;
- said ground electrode and said counter electrode being disposed substantially in parallel with each other within said reaction chamber;
- said counter electrode having a discharge surface on which are formed a plurality of concentric projections;
- said projections having relatively different heights so as to define a substantially uniformly uneven configuration over substantially the entirety of said discharge surface; and
- said counter electrode has an area width substantially equal to that of said material to be etched.

8. A parallel-plate type plasma etching device comprising:
- a reaction chamber;
- a substantially plate-like ground electrode on which a material to be etched is placed;
- a substantially plate-like counter electrode;
- said ground electrode and said counter electrode being disposed substantially in parallel with each other within said reaction chamber;
- said counter electrode having a discharge sruface on which are formed a plurality of concentric projections;
- said projections having relatively different heights so as to define a substantially uniformly uneven configuration over substantially the entirety of said discharge surface;
- said counter electrode has an area width substantially equal to that of said material to be etched; and
- a central one of said projections has a relatively smallest height, while the remaining ones of said projections have heights which gradually increase toward the outermost projection, so as to define a substantially concave configuration.

9. A parallel-plate type plasma etching device comprising:
- a reaction chamber;
- a substantially plate-like ground electrode on which a material to be etched is placed;
- a substantially plate-like counter electrode;
- said ground electrode and said counter electrode being disposed substantially in parallel with each other within said reaction chamber;
- said counter electrode having a discharge surface on which are formed a plurality of concentric projections;
- said projections having relatively different heights so as to define a substantially uniformly uneven configuration over substantially the entirety of said discharge surface;
- said counter electrode has an area width substantially equal to that of said material to be etched; and
- a central one of said projections has a relatively largest height, while the remaining ones of said projections have heights which gradually decrease toward the outermost projection, so as to define a substantially convex configuration.

10. A parallel-plate type plasma etching device comprising:
- a reaction chamber;
- a substantially plate-like ground electrode on which a material to be etched is placed;
- a substantially plate-like counter electrode;
- said ground electrode and said counter electrode being disposed substantially in parallel with each other within said reaction chamber;
- said counter electrode having a discharge surface on which are formed a plurality of concentric projections;
- said counter electrode has an area width substantially equal to that of said material to be etched; and
- said projections are each substantially 0.5 mm high and spaced at intervals of substantially 1 mm so as to define a substantially uniformly uneven configuration over substantially the entirety of said discharge surface.

* * * * *